United States Patent [19]
Metz

[11] Patent Number: 4,916,338
[45] Date of Patent: Apr. 10, 1990

[54] FET BUFFER AMPLIFIER

[75] Inventor: Arthur J. Metz, Gervais, Oreg.

[73] Assignee: Tektronix, Inc., Beaverton, Oreg.

[21] Appl. No.: 282,526

[22] Filed: Dec. 12, 1988

[51] Int. Cl.[4] .................. H03K 3/023; H03K 17/16; H03K 3/013; G06G 7/12
[52] U.S. Cl. ..................................... 307/495; 307/497; 307/446; 307/570; 307/355; 330/253; 330/254
[58] Field of Search ........ 307/491, 494, 495, 254–256, 307/570, 304, 446, 475, 355; 330/261, 254, 288, 253

[56] References Cited

U.S. PATENT DOCUMENTS

| | | | |
|---|---|---|---|
| 3,970,951 | 7/1976 | Hoffman | 307/304 |
| 4,096,430 | 6/1978 | Waldron | 307/304 |
| 4,135,162 | 1/1979 | Takahashi | 330/255 |
| 4,301,421 | 11/1981 | Yokoyama | 330/253 |
| 4,341,963 | 7/1982 | Jensen et al. | 307/497 |
| 4,346,344 | 8/1982 | Blauschild | 307/304 |
| 4,425,516 | 1/1984 | Wanlass | 307/446 |
| 4,427,903 | 1/1984 | Sugimoto | 307/355 |
| 4,451,800 | 5/1984 | Nishioka et al. | 330/261 |

FOREIGN PATENT DOCUMENTS 0032227 2/1984 Japan .................................. 307/570

OTHER PUBLICATIONS

"Electronics Engineers' Handbook", editor: Donald Fink, McGraw-Hill Book Company, Second edition, pp. 15–19.
"Designing with Field-Effect Transistors", editor: Arthur Evans, McGraw-Hill Book Company, pp. 97, 127.

Primary Examiner—Stanley D. Miller
Assistant Examiner—David R. Bertelson
Attorney, Agent, or Firm—Peter J. Meza

[57] ABSTRACT

An FET buffer amplifier circuit includes two matched FET amplifiers each consisting of an FET transistor source follower biased by a source impedance. One FET transistor source follower receives an input voltage and the second FET transistor source follower is driven by the output of an operational amplifier. The positive and negative inputs of the operational amplifier are respectively coupled to the outputs of each FET transistor source follower. A negative feedback loop is created in which the output voltage of the operational amplifier is equal to the input voltage. The two FET transistors and source impedances are matched and are under substantially identical operating conditions.

6 Claims, 1 Drawing Sheet

FET BUFFER AMPLIFIER

BACKGROUND OF THE INVENTION

This invention relates to FET buffer amplifier circuits, and more particularly to FET buffer amplifier circuits for use in track and hold applications.

A common prior art approach is shown in FIG. 1 and is commonly known as a "totem pole" configuration. The circuit consists of FET transistors 10 and 12. The gate and source of transistor 10 are coupled together, and the drain of transistor 10 is coupled to the drain of transistor 12. Transistor 10 develops a constant current, $I_{DSS}$, which flows through transistor 12. Therefore, the resultant voltage drop between the input terminal 14, the gate of transistor 12, and the output terminal 16, the source of transistor 12, is equivalent to the voltage drop across the gate to source of transistor 10, i.e. zero.

The basic totem pole configuration is not well suited to track and hold operations in which a hold capacitor gated by a sampling bridge (not shown) is coupled to the input terminal 14. The totem pole configuration has an undesirable negative input impedance. Stated another way, transistor 12 usually drives some load capacitance as well as the gate to drain capacitance of transistor 10. The result is that the source voltage of transistor 12 lags the gate voltage of transistor 12. (negative input impedance) The effect in track and hold circuits is that the source voltage continues to change after the sampling bridge is switched off. This change in gate to source voltage causes charge to be transferred from the gate to source capacitor to the hold capacitor, introducing a frequency dependent error in the held voltage.

Although the basic configuration has often been modified to improve supply rejection, noise, thermal distortion, offset voltage, or input impedance, the modification is usually at the expense of one of the other aspects of performance. For example, FIG. 2 shows a basic totem pole configuration which has been modified to improve power supply rejection and thermal distortion. This prior art approach includes transistors 18 and 20 in a common base configuration to improve the output impedance of transistors 10 and 12. While this prior art configuration has some improvement in performance, power dissipation is increased. Also, for the same amount of output voltage swing at output terminal 16, larger supply voltages are required.

What is desired is an FET buffer amplifier circuit having reduced lag in the source voltage suitable for track and hold applications, low thermal distortion, low offset voltage, high power supply rejection, and low noise without increased power dissipation or the need for increased operating supply voltages.

SUMMARY OF THE INVENTION

In a preferred embodiment of the present invention, an FET buffer amplifier circuit includes two matched FET amplifiers each consisting of an FET transistor source follower biased by a source impedance. One FET transistor source follower receives an input voltage and the second FET transistor source follower is driven by the output of an operational amplifier. The positive and negative inputs of the operational amplifier are respectively coupled to the outputs of each FET transistor source follower. A negative feedback loop is created in which the output voltage of the operational amplifier is equal to the input voltage. Since the two FET transistors and source impedances are matched and have substantially identical operating conditions any thermal distortion in one transistor is compensated by a similar distortion in the other. Similarly, offset voltage, power supply rejection and other performance criteria impacted by transistor processing variations are improved since process variations affect each FET transistor equally. The circuit configuration also ensures that lower supply voltages may be used than the prior art circuits of FIGS. 1 and 2 since only one FET transistor is used in each FET amplifier. The design of the present invention allows the FET transistor size to be chosen for noise or other performance criteria without regard to the resultant large currents produced. Further, the input of the buffer amplifier has a reduced negative input impedance since the source follower FETs drive a resistive load and not the capacitance of another FET transistor.

BRIEF DESCRIPTION OF THE DRAWINGS

For a better understanding of the invention, and to show how the same may be carried into effect, reference will now be made, by way of example, to the accompanying drawings, in which.

DESCRIPTION OF THE PREFERRED EMBODIMENT

Figure 3:
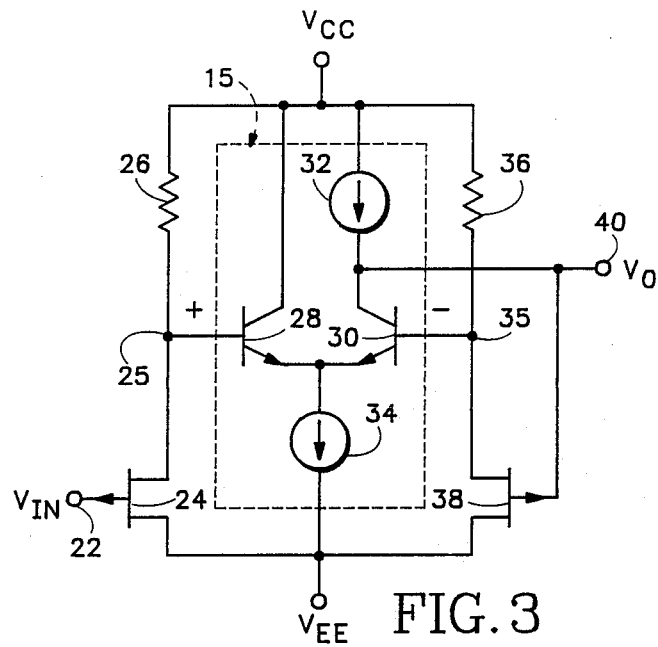
FIG. 3 is a schematic diagram of an FET buffer amplifier circuit in accordance with the present invention.

The circuit shown in FIG. 3 includes an FET amplifier consisting of FET transistor 24 and a source impedance 26. The gate of FET transistor 24 is designated as terminal 22 which receives a voltage input. Transistor 24 is configured in the source follower mode in which the source voltage follows the voltage on the gate. In FIG. 3, the source is designated as node 25. The source impedance 26 may be a resistor or active load such as the collector of an FET or bipolar transistor. A matched FET amplifier consists of FET transistor 38 and a source impedance 36. The two FET amplifiers are matched if FET transistors 24 and 38 have substantially the same width to length (W/L) ratio and if the value of source impedances 26 and 36 are substantially the same. The gate of FET transistor 38 is designated as terminal 40 which is the voltage output of the FET buffer amplifier circuit. Transistor 38 is also configured in the source follower mode, the source being designated as node 35. Similarly, the source impedance 36 may be a resistor or active load such as the collector of an FET or bipolar transistor.

The voltages at nodes 25 and 35 are sensed by the positive and negative inputs of operational amplifier 15. The output of the operational amplifier 15 forms the voltage output of the FET buffer amplifier circuit, and is also fedback to the input of FET transistor 38. If the gain of the operational amplifier is sufficiently high, and source impedances 26 and 36 and FET transistors 24 and 38 are matched, the output voltage at terminal 40 is substantially equal to the input voltage received at input terminal 22.

In the embodiment shown in FIG. 3, the operational amplifier 15 consists of bipolar transistors 28 and 30, and current sources 32 and 34. The emitter current source 34 biases bipolar transistors 28 and 30. Current source 32 forms a load impedance for transistor 30. It is desirable that the value of current source 34 is twice the value of current source 32. It is also desirable that the emitter area of transistor 28 be equal to that of transistor 30. In operational amplifier 15, the base of transistor 28 forms the positive input, the base of transistor 30 forms the negative input, and the collector of transistor 30 forms the output.

Figure 4:
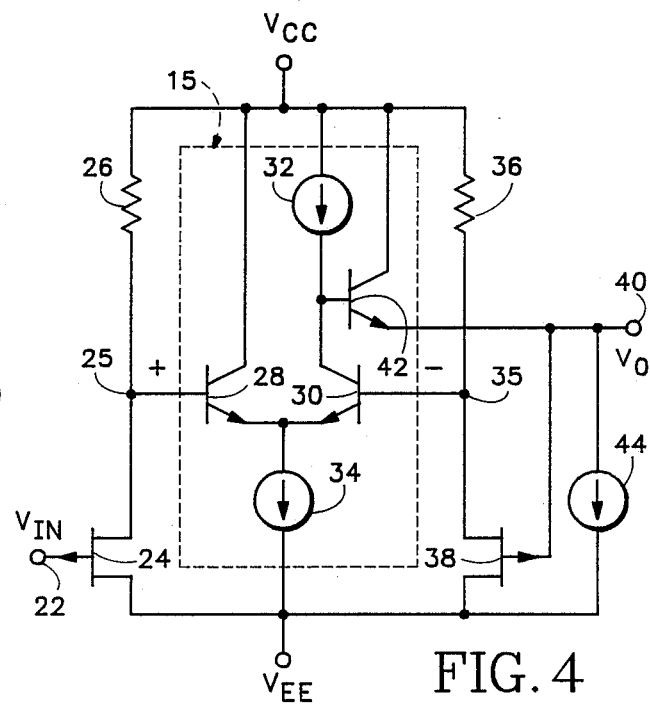
FIG. 4 is a schematic diagram of an alternative embodiment of an FET buffer amplifier circuit in accordance with the present invention.

In the embodiment shown in FIG. 4, the operational amplifier 15 consists of bipolar transistors 28, 30 and 42, and current sources 32, 34, and 44. As in the embodiment of FIG. 3, the emitter current source 34 biases bipolar transistors 28 and 30 and current source 32 forms a load impedance for transistor 30. Similarly, it is desirable that the value of current source 34 is twice the value of current source 32 and that the emitter area of transistor 28 be equal to that of transistor 30. In operational amplifier 15, the base of transistor 28 forms the positive input, the base of transistor 30 forms the negative input. The output of operational amplifier 15 is the emitter of emitter follower transistor 42 which is biased by current source 44. Due to the buffering of transistor 42, operational amplifier 15 has lower output impedance than the embodiment of FIG. 3.

In both the embodiments of FIGS. 3 and 4 it is desirable that source impedances 26 and 36 and FET transistors 24 and 38 match. Due to the matching, the FET buffer amplifier is substantially insensitive to changes in the environment or in fabrication process variations. For example, thermal distortions are minimized since any changes in temperature affect transistor 24 and 38 equally, and there is no thermal differential signal. Other performance criterion which are a function of process variations such as the pinchoff voltage and $I_{DSS}$ of the FET transistors will be minimized since the changes will be the same in each matched FET transistor. Thus, offset voltage, power supply rejection and other performance criteria impacted by transistor processing variations are improved since process variations affect each FET transistor equally.

Figure 1:
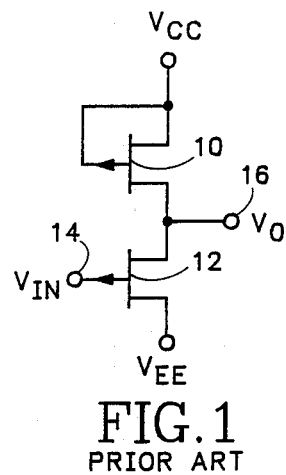
FIG. 1 is a schematic diagram of a prior art FET buffer amplifier circuit.
Figure 2:
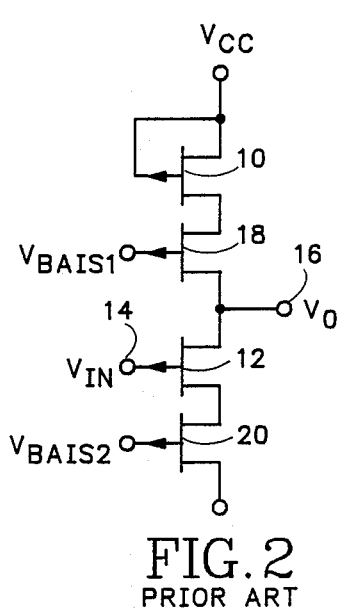
FIG. 2 is a schematic diagram of another prior art FET buffer amplifier circuit.

The circuit configuration of FIGS. 3 and 4 also ensures that lower supply voltages may be used than the prior art circuits of FIGS. 1 and 2 since only one FET transistor is used in each FET amplifier. The total voltage drop between the power supplies is determined by the drain to source voltage of one FET transistor plus the total voltage across one source impedance. This total voltage is usually lower than the drain to source voltage across two or four FET transistors as shown in the prior art embodiments of FIGS. 1 and 2.

The design of the present invention allows the FET transistor size to be chosen for noise or other performance criteria without regard to the resultant large currents produced. Thus FET transistors 24 and 38 may be made sufficiently large for low noise, and yet the current flowing through each device is determined by source impedance 26 and 36. In the prior art approaches of FIGS. 1 and 2, the current is IDSS which increases as device size increases.

The input of the buffer amplifier has a much lower negative input impedance since the source follower FETs 24 and 38 drive source impedances 26 and 36 and not the capacitance of another FET transistor. If desired source impedances 26 and 36 may be fabricated using thin film resistors in which the parasitic capacitance is negligible. Further, the value of source impedances 26 and 36 may be selected such that the time constant of source impedance 26 or 36 times the input capacitance of transistors 28 or 30 is equal to the time constant of the source impedance times the gate to source capacitance of FET transistors 24 and 38. In this way, a compensated attenuator is created which has an essentially flat frequency response. Proper selection of source impedances 26 and 36 results in maximum bandwidth due to faster settling time.

The present invention is not restricted to the particular embodiment that has been described, and variations may be made therein without departing from the scope of the invention as defined in the appended claims and equivalents thereof. For example, operational amplifier 15 may be as shown in FIG. 3 or FIG. 4, or any other design having a positive input, a negative input, and an output. Further, FIGS. 3 and 4 disclose P-channel FET transistors and NPN bipolar transistors. It is well known to those skilled in the art that N-channel FET transistors can be used if PNP bipolar transistors are also used, and the FET buffer amplifier circuit is also correctly biased.

I claim:

1. An FET buffer amplifier circuit having a voltage input and a voltage output comprising:
   (a) a first source follower FET amplifier having an input and an output, the input forming the voltage input;
   (b) a second source follower FET amplifier having an input and an output; and
   (c) an operational amplifier having a positive input, a negative input, and an output, the positive input being coupled to the output of said first source follower FET amplifier, the negative input being coupled to the output of said second source follower FET amplifier, and the output coupled to the input of said second source follower FET amplifier to form the voltage output.

2. An FET buffer amplifier circuit as in claim 1 wherein each of said first and second source follower FET amplifiers comprise:
   (a) an FET transistor having a gate forming the input, a source, and a drain coupled to a first source of supply voltage; and
   (b) a source impedance having one end coupled to the source of said FET transistor to form the output, and having the other end coupled to a second source of supply voltage.

3. An operational amplifier as in claim 2 wherein the W/L ratio of both FET transistors is substantially equal, and the value of each load impedance is substantially equal.

4. An FET buffer amplifier circuit as in claim 1 wherein the operational amplifier comprises:
   (a) first and second bipolar transistors each having a base, an emitter, and a collector, the emitters being coupled together and to
   (b) a first current source, the base of the first bipolar transistor forming the positive input, the base of the second bipolar transistor forming the negative input, the collector of the first bipolar transistor being coupled to a source of supply voltage, and the collector of the second bipolar transistor being coupled to
   (c) a second current source to form the output.

5. An FET buffer amplifier circuit as in claim 1 wherein the operational amplifier comprises:
(a) first, second, and third bipolar transistors each having a base, an emitter, and a collector, the emitters of the first and second bipolar transistors being coupled together and to
(b) a first current source, the base of the first bipolar transistor forming the positive input, the base of the second bipolar transistor forming the negative input, the collector of the first bipolar transistor being coupled to a first source of supply voltage, the collector of the second bipolar transistor being coupled to
(c) a second current source and to the base of the third bipolar transistor, the collector of the third bipolar transistor being coupled to a second source of supply voltage, and the emitter of the third bipolar transistor forming the output.

6. An FET buffer amplifier circuit as in claim 5 further comprising a third current source coupled to the voltage output.

* * * * *